United States Patent [19]

Gellekink et al.

[11] Patent Number: 4,667,200
[45] Date of Patent: May 19, 1987

[54] PULSE RADAR APPARATUS

[75] Inventors: Bernard Gellekink, Ootmarsum; Willem A. Hol, Hengelo, both of Netherlands

[73] Assignee: Hollandse Signaalapparten B.V., Hengelo, Netherlands

[21] Appl. No.: 549,943

[22] Filed: Nov. 9, 1983

[30] Foreign Application Priority Data

Nov. 16, 1982 [NL] Netherlands .......................... 8204435
Dec. 22, 1982 [NL] Netherlands .......................... 8204935

[51] Int. Cl.[4] .............................................. G01S 7/30
[52] U.S. Cl. .................................. 342/202; 342/195; 342/194
[58] Field of Search .............. 343/5 DP, 5 FT, 5 NQ, 343/7.7, 17.2 R, 17.1 R; 329/50

[56] References Cited

U.S. PATENT DOCUMENTS 3,927,405 12/1975 Poinsard et al. ............... 343/17.2 R
3,987,442 10/1976 McLeod, Jr. ........................ 343/7.7
4,333,080  6/1982 Collins et al. ..................... 343/5 NQ
4,344,040  8/1982 Reilly et al. ............................ 329/50

OTHER PUBLICATIONS

M. Skolnik, *Intro. To Radar Systems*; p. 119-121, (McGraw-Hill, 1980).

*Primary Examiner*—Thomas H. Tarcza
*Assistant Examiner*—Bernarr Earl Gregory
*Attorney, Agent, or Firm*—Robert J. Kraus

[57] ABSTRACT

A pulse radar apparatus is provided with a coherent transmitting and receiving unit (1) for the transmission of radar pulses, the reception of echo signals, and the conversion of the echo signals into signals of an intermediate frequency $f_{if}$, which may be shifted through a Doppler frequency $f_d$. The echo signals with frequency $f_{if}+f_d$ are fed to a detector (7) for the coherent phase detection with a frequency $f_{if}+f_c$. The detected signals are fed to an analog-to-digital converter (10), which operates at a frequency of approximately $4f_c$. The pulse radar apparatus further includes accumulators (12, 13), alternately fed with the output signals of the analog-to-digital converter (10) each time for a given period, after which period the output signals of the accumulators (12, 13) are representative of the orthogonally detected components of the echo signals.

1 Claim, 3 Drawing Figures

PULSE RADAR APPARATUS

BACKGROUND OF THE INVENTION

The invention relates to a pulse radar apparatus, provided with a coherent transmitting and receiving unit for the transmission of radar pulses, the reception of echo signals, and the conversion of the echo signals into signals of an intermediate frequency $f_{if}$, which may be shifted through a Doppler frequency $f_d$.

Coherent phase detection of the i.f. signals obtained is widely known. To prevent the effect of blind phases, a quadrature detector is utilised. Such a detector is used to detect the i.f. signal in two mutually orthogonal components I and Q. For further processing in a video processor, these components are digitised. In the cases when the radar receiver is accommodated in the antenna housing and the antenna is rotatably mounted, it is customary to supply the phase-detected signals to the fixedly mounted analogue-to-digital converters and the video processor via a slip-ring assembly. With the use of a quadrature detector, two slip rings are required. If, as with the use of a phase array antenna, a large number of receivers are employed, the number of slip rings is large as well; this is a serious disadvantage. The present invention has for its object to reduce this disadvantage.

SUMMARY OF THE INVENTION

According to the invention, the pulse radar apparatus, as set forth in the opening paragraph, comprises: a detector for the coherent phase detection of the i.f. signals with a frequency shifted through a value $f_c$ with respect to the intermediate frequency $f_{if}$; an analogue-to-digital converter operating at a frequency of approximately $4f_c$; and a first and a second accumulator alternately fed with the output signals of the analogue-to-digital converter each time for a given period, after which period the output signals of the first and second accumulators are representative of the orthogonally detected components of at least a portion of the echo signal.

The I and Q components of the video signal or of a portion of the video signal are acquired through one single phase detector, requiring for each receiver only one slip ring, instead of two.

BRIEF DESCRIPTION OF THE DRAWINGS

The invention will now be described in greater detail with reference to the accompanying figures, of which.

DESCRIPTION OF THE PREFERRED EMBODIMENTS

Figure 1:
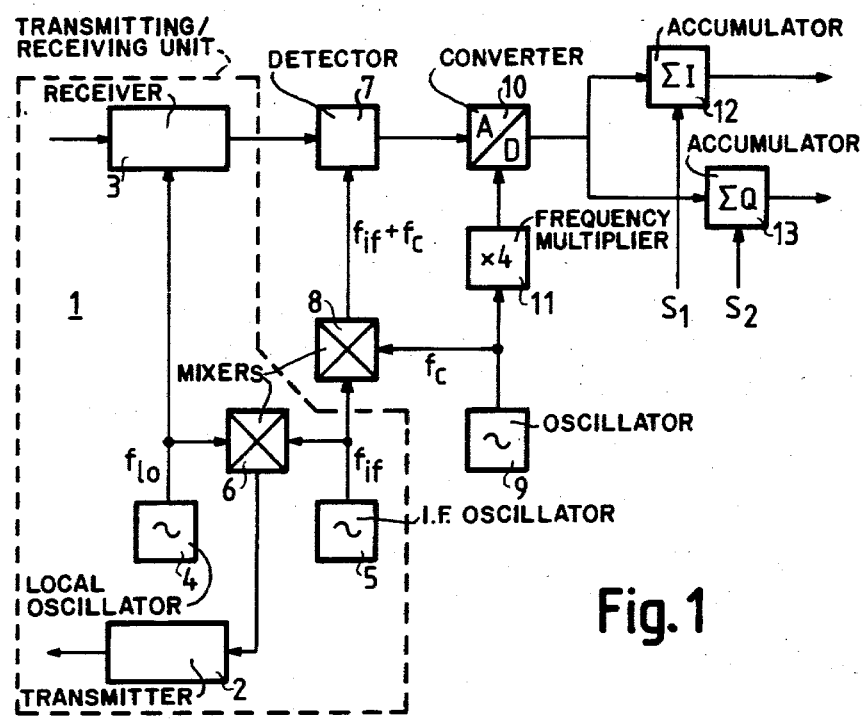
FIG. 1 is a block diagram of the pulse radar apparatus according to the invention.

The transmitting and receiving unit 1 comprises a transmitter 2, a receiver 3, a local oscillator 4, an intermediate frequency oscillator 5, and a mixer 6. Local oscillator 4 permanently supplies a signal of frequency $f_{lo}$, and intermediate frequency oscillator 5 a signal of frequency $f_{if}$. Mixer 6 applies a signal of frequency $f_o = f_{lo} + f_{if}$ to transmitter 2, which produces radar pulses of the frequency $f_o$. Receiver 3 receives echo signals of frequency $f_o \pm f_d$, where $f_d$ is the Doppler frequency. The echo signal frequency is changed to the intermediate frequency $f_{if} \pm f_d$ coherently by the local oscillator signal. Coherent phase detection of the i.f. signal occurs in detector 7 at a frequency $f_{if} + f_c$. In mixer 8 this frequency is produced constantly from the signal of i.f. oscillator 5 and the signal of oscillator 9; the frequency of the latter signal is $f_c$. The output signal frequency of detector 7 will then be $f_c \pm f_d$; the envelope of this output signal represents the video signal, as would be obtained in the conventional way if the phase detection were to occur at frequency $f_{if}$. The output signal of detector 7 is digitised in the analogue-to-digital converter 10 at a frequency of about $4f_c$. A frequency multiplier derives this frequency from the signal of oscillator 9.

Figure 2:
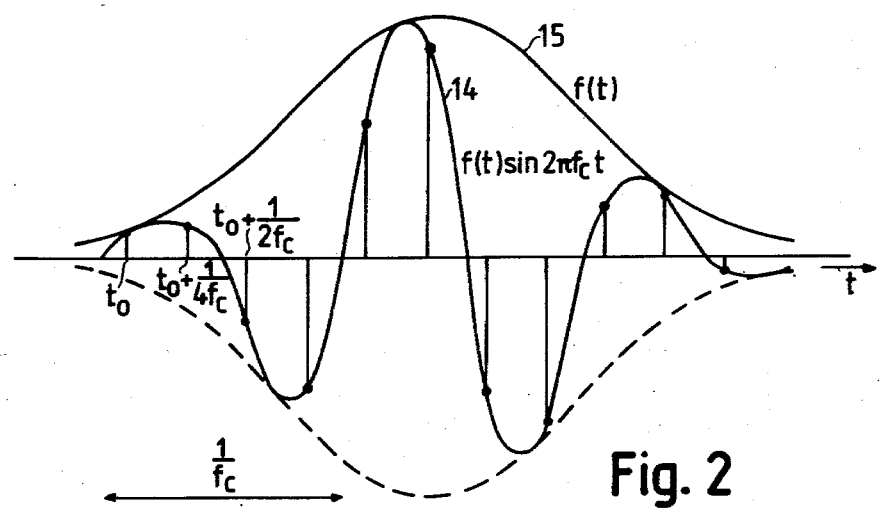
FIG. 2 is a diagram useful in explaining the operation of this pulse radar apparatus.

In FIG. 2 the curve 14 represents the phase-detected signal. Apart from the Doppler frequency, this signal can be represented by $f(t) \sin 2\pi f_c t$, where $f(t)$ is the envelope given by curve 15. The samples to be digitised are taken at times $$t_o, \; t_o + \frac{1}{4f_c}, \; t_o + \frac{1}{2f_c}, \; t_o + \frac{3}{4f_c}, \; t_o + \frac{1}{f_c}, \; t_o + \frac{5}{4f_c}, \; \text{etc.}$$

The magnitude of the samples taken at these times can be expressed by:

$$+f(t_o) \sin 2\pi f_c t_o + f\left(t_o + \frac{1}{4f_c}\right) \cos 2\pi f_c t_o,$$

$$-f\left(t_o + \frac{1}{2f_c}\right) \sin 2\pi f_c t_o - f\left(t_o + \frac{3}{4f_c}\right) \cos 2\pi f_c t_o,$$

$$+f\left(t_o + \frac{1}{f_c}\right) \sin 2\pi f_c t_o + f\left(t_o + \frac{5}{4f_c}\right) \cos 2\pi f_c t_o, \text{ etc.}$$

These values are fed alternately to a first and a second accumulator 12 and 13, respectively, each time for a given period T; this process is subject to the control of signals $S_1$ and $S_2$ from oscillator 9. After the period T the contents of accumulators 12 and 13 can be represented by:

$$\sin 2\pi f_c t_o \cdot \sum_i f\left(t_o + \frac{2i}{4f_c}\right) \cdot (-1)^i \text{ and}$$

$$\cos 2\pi f_c t_o \cdot \sum_i f\left(t_o + \frac{1}{4f_c} + \frac{2i}{4f_c}\right) \cdot (-1)^i.$$

Period T can be so selected that the complete detected echo signal falls within this period; the contents of the two accumulators are then representative of the orthogonal components of the detected echo signal. It is also possible to select T such that only a portion of the detected echo signal falls within this period. In such a case, several orthogonal component pairs are supplied for the echo signal. In any case, the period T is such that the quantity cT, where c is the velocity of light, represents the magnitude of the range quants into which the radar range is divided.

Of the successive samples from the analogue-to-digital converter 10, the $$f(t_o) \sin 2\pi f_c t_o, \, 0, \, -f\left(t_o + \frac{1}{4f_c}\right) \sin 2\pi f_c t_o, \, 0,$$

$$+f\left(t_o + \frac{1}{f_c}\right) \sin 2\pi f_c t_o, \, 0, \ldots,$$

values are supplied to accumulator 12 and the $$0, f\left(t_o + \frac{1}{4f_c}\right) \cos 2\pi f_c t_o, \, 0, \, -f\left(t_o + \frac{3}{4f_c}\right) \cos 2\pi f_c t_o,$$

$$0, \, +f\left(t_o + \frac{5}{4f_c}\right) \cos 2\pi f_c t_o$$

values to accumulator 13.

Figure 3:
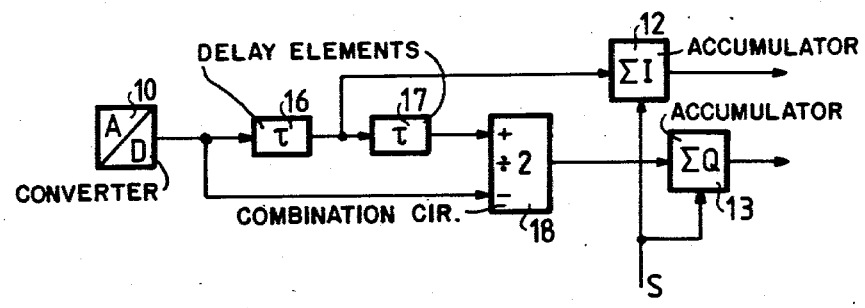
FIG. 3 illustrates a second embodiment of a part of the pulse radar apparatus according to the invention.

I-accumulator 12 and Q-accumulator 13 may be construed as n-point transversal filters, where n is the number of samples taken in period T. If say n=8, the weight factors of these filters may be indicated by {1, 0, −1, 0, 1, 0, −1, 0} for the I-accumulator and by {0, 1, 0, −1, 0, 1, 0, −1} for the Q-accumulator. The I- and Q-accumulator output signals have mutually an incorrect time validity, because the I and Q values are shifted through a time $\tau = 1/(4f_c)$ with respect to each other. Should the amplitudes $$f\left(t_o + \frac{1}{4f_c}\right), \, i = 0, 1, 2, \ldots,$$

be equal for all values of i in the interval T, the $$\sum_i I_i \text{ and } \sum_i Q_i$$

values, i.e. the output signals of accumulators 12 and 13, would be determined as though the $I_i$ and $Q_i$ values would have been established at the same time. From curve 14 it is seen however that these amplitudes differ. So far as the $$\sum_i I_i \text{ and } \sum_i Q_i$$

values are used exclusively for the video detection, this has no drawbacks; if these values are utilised for a DFT Doppler processing, of if the $$\sum_i I_i \text{ and } \sum_i Q_i$$

values from different receivers are applied for DFT beamforming, such as described in: "Digital Multiple Beamforming Techniques for Radar", by Ruvin, A. E. and Weinberg, L., IEEE EASCON '78 Record, pp. 152-163, Sept. 25-27, 1978, IEEE Publication 78 CH 1352-4 AES, the incorrect time validity of the $$\sum_i I_i \text{ and } \sum_i Q_i$$

values means that amplitude and phase errors occur in the input signals of the DFT. The correct time validity is not obtainable through phase shifting, as the amplitude difference will remain in such a case. With a very large number of samples in the period T, the errors are indeed averaged out, but the accumulators obtain such a narrow-band value that a very unfavourable signal-to-noise ratio arises. The errors would also be avoided if the samples which could be considered were exclusively those taken about the peak of the video signal; however, this does not work in practice. In case the $$\sum_i I_i \text{ and } \sum_i Q_i$$

values are used for DFT Doppler processing the amplitude and phase errors would give rise to image frequencies in the DFT output channels; the Doppler frequency $f_d$ will then give an image frequency of $f_s - f_d$, where $f_s$ is the sample frequency. If various $$\sum_i I_i \text{ and } \sum_i Q_i$$

values are used for DFT beamforming, an echo signal of a target situated $\alpha°$ below the antenna main axis gives a DFT output signal that is indicative of a weaker fictitious target situated $\alpha°$ above the antenna main axis. A virtually correct time validity of the $$\sum_i I_i \text{ and } \sum_i Q_i$$

values is obtained if the circuit coupled to the analogue-to-digital converter 10 to obtain these values can be construed as a transversal filter. In case n=8, the weight factors of this filter may be represented by {0, 1, 0, −1, 0, 1, 0, −1, 0} and {½, 0, −1, 0, 1, 0, −1, 0, ½} or, in case n=6, by {0, 1, 0, −1, 0, 1, 0} and {½, 0, −1, 0, 1, 0, −½}. FIG. 3 shows an implementation of such filters. The I-accumulator 12 and the Q-accumulator 13 can each be construed as a transversal filter having weight factors {1, 0, −1, 0, 1, 0, −1} in case n=8, or {1, 0, −1, 0, 1, 0} in case n=6; the conrol signals for the two accumulators are therefore the same and are denoted by S. I-accumulator 12 however must now be combined with a 3-point transversal filter having weight factors (0, 1, 0), and Q-accumulator 13 with a 3-point transversal filter having weight factors (½, 0, −½). The 3-point transversal filter having weight factors (0, 1, 0) is constituted by the delay element 16 and convolves with the filter having weight factors {1, 0, −1, 0, 1, 0, −1, 0}, thus with the I-accumulator, to form a filter having weight factors {0, 1, 0, −1, 0, 1, 0, −1, 0}. The 3-point transversal filter having weight factors (½, 0, −½) is constituted by the delay elements 16 and 17 and the combination circuit 18 determining the difference between the signal delayed over 2τ and the signal directly from the analogue-to-digital converter and dividing the difference by 2; this filter performs a convolution with the filter having weight factors {1, 0, −1, 0, 1, 0, −1, 0}, thus with the Q-accumulator, to form a filter having weight factors {½, 0, −1, 0, 1, 0, −1, 0, ½}.

We claim:

1. A pulse radar apparatus, provided with a coherent transmitting and receiving unit for the transmission of radar pulses, the reception of echo signals, and the conversion of said signals into signals of an intermediate frequency $f_{if}$, which may be shifted through a Doppler frequency $f_d$, characterized in that the pulse radar apparatus comprises:

(a) a detector for the coherent phase detection of said intermediate frequency signals with a frequency shifted through a value $f_c$ with respect to the intermediate frequency $f_{if}$;

(b) an analog-to-digital converter electrically connected to the detector, said converter operating at a frequency of approximately $4f_c$;

(c) first and second serially-connected delay elements, each having a delay of approximately $1/(4f_c)$, the first delay element having an input electrically connected to an output of the analog-to-digital converter;

(d) a combination circuit, having first and second inputs electrically connected to an output of the second delay element and to the output of the analog-to-digital converter, respectively, for determining the half difference of the signals supplied by said converter and by the second delay element; and (e) first and second accumulators having respective signal inputs electrically connected to the output of the first delay element and to an output of the combination circuit, and having respective timing inputs for controlling the times at which said accumulators accept signals at the signal inputs, said times being selected such that the output signals of said first and second accumulators are representative of the orthogonally detected components of at least a portion of the echo signal.

* * * * *